(12) United States Patent
Barke et al.

(10) Patent No.: US 9,400,313 B2
(45) Date of Patent: Jul. 26, 2016

(54) METHOD AND DEVICE FOR DETERMINING THE ACTUAL CAPACITY OF A BATTERY

(71) Applicant: AUDI AG, Ingolstadt (DE)

(72) Inventors: Alexander Barke, Ingolstadt (DE); Rolf Naumann, Michelau (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/403,897

(22) PCT Filed: May 17, 2013

(86) PCT No.: PCT/EP2013/001484
§ 371 (c)(1),
(2) Date: Nov. 25, 2014

(87) PCT Pub. No.: WO2013/178330
PCT Pub. Date: Dec. 5, 2013

(65) Prior Publication Data
US 2015/0192643 A1  Jul. 9, 2015

(30) Foreign Application Priority Data

May 26, 2012 (DE) .......................... 10 2012 010 486

(51) Int. Cl.
*G01N 27/416* (2006.01)
*G01R 31/36* (2006.01)

(52) U.S. Cl.
CPC ........ *G01R 31/3637* (2013.01); *G01R 31/3679* (2013.01); *G01R 31/3651* (2013.01)

(58) Field of Classification Search
USPC ........................................................ 324/433
See application file for complete search history.

(56) References Cited

U.S. PATENT DOCUMENTS 6,362,598 B2 * 3/2002 Laig-Horstebrock ......... 320/132
6,388,447 B1   5/2002 Hall et al.
(Continued)

FOREIGN PATENT DOCUMENTS

CN     1228540 A    9/1999
CN     1862279 A    11/2006
(Continued)

OTHER PUBLICATIONS

International Search Report issued by the European Patent Office in International Application PCT/EP2013/001484 on Aug. 16, 2013.
(Continued)

*Primary Examiner* — Richard Isla Rodas
*Assistant Examiner* — David V Henze-Gongola
(74) *Attorney, Agent, or Firm* — Henry M. Feiereisen LLC.

(57) ABSTRACT

A method and a device for determining the actual capacity of a battery uses a set of characteristic curves, wherein at the start of a discharge process the initial voltage of the battery, the magnitude of the discharge current and the temperature of the battery are determined. From this, by comparison with the data provided in the set of characteristic curves, a characteristic curve is selected and an initial state of the battery is determined. At the end of the discharge process, the final voltage of the battery is measured. The final voltage is compared, at the end of the discharge, with the voltage expected based on the selected characteristic curve and, in the event that the final voltage is smaller than the voltage expected based on the discharge process, it is determined that the actual capacity of the battery is smaller than the available capacity assumed at the start of the discharge process.

7 Claims, 2 Drawing Sheets

(56) References Cited

U.S. PATENT DOCUMENTS

| | | | |
|---|---|---|---|
| 7,659,018 B2 | 2/2010 | Aoyagi et al. | |
| 2013/0204561 A1* | 8/2013 | Daiss | G01R 31/362 702/63 |

FOREIGN PATENT DOCUMENTS

| | | |
|---|---|---|
| CN | 101101323 A | 1/2008 |
| CN | 101975927 A | 2/2011 |
| CN | 102455410 A | 5/2012 |
| DE | 39 10 904 | 10/1990 |
| DE | 102007037041 | 2/2009 |
| DE | 102010006965 | 8/2011 |
| EP | 0 410 716 | 1/1991 |
| EP | 1 111 705 | 6/2001 |
| EP | 1 314 992 | 5/2003 |
| JP | 2002-216818 | 8/2002 |
| JP | 2002-243813 | 8/2002 |
| WO | WO 2011095513 A1 * | 8/2011 ........... G01R 31/362 |

OTHER PUBLICATIONS

Chinese Search Report issued on Mar. 2, 2016 with respect to counterpart Chinese patent application 2013800276392.

English Translation of Chinese Search Report issued on Mar. 2, 2016 with respect to counterpart Chinese patent application 2013800276392.

* cited by examiner

METHOD AND DEVICE FOR DETERMINING THE ACTUAL CAPACITY OF A BATTERY

CROSS-REFERENCES TO RELATED APPLICATIONS

This application is the U.S. National Stage of International Application No. PCT/EP2013/001484, filed May 17, 2013, which designated the United States and has been published as International Publication No. WO 2013/178330 and which claims the priority of German Patent Application, Serial No. 10 2012 010 486.3, filed May 26, 2012, pursuant to 35 U.S.C. 119(a)-(d).

BACKGROUND OF THE INVENTION

The present invention relates to a method and a device for determining the actual capacity of a battery by using a battery characteristic.

In a motor vehicle, wherein a battery (=rechargeable electrical energy source; secondary battery or accumulator) is used as the sole or as an additional energy source aside from an internal combustion engine for driving the vehicle (electric vehicle, hybrid vehicle), the capacity of the battery plays an important role for the range of the motor vehicle to be travelled by the vehicle without recharging the battery.

It is known that the removable amount of energy, i.e. the removable amount of current, of for example a conventional lithium-ion battery decreases with increasing age and/or the number at charging and discharging cycles.

This loss of capacity, commonly referred to as aging and representing a manifestation of the change in the behavior of batteries during charging and discharging (when used as intended) or due to time-related aging, can presently only be inadequately determined.

The known methods for determining the loss of capacity are either very complex and/or are difficult to parameterize (e.g. with impedance measurements) or the employed aging models are not completely or only inadequately parameterized, which can cause significant deviations in the calculation.

Simple methods have usually the disadvantage that important parameters cannot be considered or are simply also not known (e.g. the power loss or efficiency, which need not be constant over the lifetime and the use the batteries).

An unambiguous statement about the current energy content, i.e. the currently available amount of current, can therefore not easily be made during an ongoing or normal operation. Because the battery capacity is reduced due to aging, any conclusion concerning the availability will fail or be inaccurate when the actual (or corrected) battery capacity is not properly tracked.

Many known methods for determining the actual capacity of a battery require the determination of charge states (State of Charge, SOC) of the battery, based on measurements of open circuit voltages (OCV) of the batteries, as well as the measurement of the amount of current removed between two charge states.

For example, EP 1 314 992 A2 describes a device and a method for determining the capacity of a battery for propelling an electric car, wherein a first charge state of a battery and a second charge state of a battery are determined by way of the respective open circuit voltages in the load-free state and the actual capacity of the battery is determined from the amount of discharge current flowing between the two charge states.

DE 10 2007 037 041 A1 discloses a method and a device for detecting the battery state of an acid battery by using a stored battery model. The open circuit voltage of the acid battery as a function of the charge that can be removed from the battery is stored in form of a characteristic curve. A first parameter is then determined, which describes the loss of battery capacity due to aging of the battery and an acid stratification of the battery. Furthermore, a second parameter is determined which provides information about the slope the characteristic curve. Moreover, the stored characteristic curve is adapted by taking into account the first and second parameter.

According to this document, the removable amount of energy and the actual capacity of an acid battery are determined by determining an open-voltage-ampere-hours characteristic curve. In comparison to a new battery without acid stratification, the characteristic curve of an aged battery is displaced upward in a parallel fashion, whereas the characteristic curve of a battery with acid stratification has an increased slope. The open-voltage-ampere-hours characteristic curve can be determined by measuring the open-circuit voltage of the battery before and after a discharge. The stored characteristic curve is then adapted by using the actually determined voltage-ampere-hours characteristic curve.

DE 10 2010 006 965 A1 describes a method for determining at least a range of a battery characteristic curve for a battery in a vehicle, wherein the actual charge state of the battery is determined from measured battery parameters, an adjustment value is then determined from the difference between a measured battery parameter and a standard value, which is determined from a standard battery characteristic curve by taking into account the determined charge state, and at least one range of a new battery characteristic curve is determined by adding the adjustment value to the standard battery characteristic curve.

According to this document, the actual battery characteristic curve is determined by measuring of open-circuit voltages after a longer resting phase of the battery at different charge states of a battery. The deviation of the actual battery characteristic curve (open-circuit voltage-actual charge state characteristic curve) from the battery characteristic curve of a "standard battery" is determined based on a comparison of the respective open-circuit voltages for specified charge states or based on a comparison of respective charge states for specified open-circuit voltages.

A computing device is known from JP 2002-243 813 A, which calculates a change in the charge state of a battery from the time-integrated discharge current of the battery based on the open-circuit voltages at the start time of the integration and the end time of the integration, as well as the correlation between the open-circuit voltages and the charge state of the battery. The computing device also calculates the diminished capacity of the battery over time based on an integrated discharge current value calculated based on the discharge current and the change of the charge state. In addition, the computing device calculates the capacity degradation rate based on the diminished capacity over time and the initial capacity of the battery.

DE 39 10 904 A1 discloses a method for monitoring the charge state of a rechargeable, sealed battery, wherein the voltage $U_{KL}$ at the battery terminals is measured after charging a battery—following at least one load—and stored as open-circuit voltage $U_0$, and wherein at different times the instantaneous voltage $U_n$ is measured at the battery terminals and the discharge state is determined as a function of the difference between the open-circuit voltage $U_0$ and the instantaneous voltage $U_n$.

As can be seen from this short overview, all the above described methods and devices require the measurement of an open-circuit voltage (OCV) of the battery. However, this open-circuit voltage can be measured with sufficient accuracy only after a not insignificant amount of time has passes after the end of a discharge. As is evident, for example, from FIG. 6 of EP 1 314 992 A2, a resting phase of up to 3000 seconds, i.e. of up to 50 minutes, may be required before the voltage reaches a stable value following the termination of a discharge process.

SUMMARY OF THE INVENTION

It is the object of the present invention, to provide a method and a device for determining the actual capacity of a battery, which can overcome the disadvantages of the prior art.

The method according to the invention for determining the actual capacity of a battery is carried out by using a characteristic curve field, wherein at the start of a discharge process the initial voltage $U_{initial}$ of the battery, the magnitude of the discharge current and the temperature the battery are determined, wherefrom a characteristic curve is selected through comparison with the data in the characteristic curve field and an initial state the battery is defined. At the end of the discharge process, the final voltage $U_{meas}$ of the battery is measured and this final voltage $U_{meas}$ is compared at the end of the discharge process with the expected voltage $U_{expected}$ based on the selected characteristic curve, and in the event that the final voltage ($U_{meas}$) is smaller than the expected voltage ($U_{expected}$) due to the discharge process, it is concluded that the actual capacity of the battery is smaller than the assumed removable capacity at the start of the discharge process.

The method according to the invention is characterized in that assessing the aging state of a battery does not require the measurement of an open-circuit voltage (OCV), that the method can be used with normal applications, is easy to use because it does not require special test modes or procedures and does not rely on complicated parameters and/or models. With the method according to the invention, a specific conclusion about the actual energy content of a battery can be readily made during the ongoing operation. An exact conclusion about the actually available amount of current of a battery is thus possible based on the actual or corrected battery capacity that is correctly tracked by the method according to the invention.

According to a first advantageous embodiment of the invention, the actual capacity of the battery is determined with the method according to the invention by repeating the above-described steps several times in the specified sequential order and by assessing the determined difference between the final voltage $U_{meas}$ and the expected voltage $U_{expected}$.

Advantageously, the actual capacity of the battery can be determined with the method according to the invention after the above-described steps have been carried out sequentially at least 5 times.

Advantageously, the actual capacity of the battery may for example be determined as follows: the initial voltage $U_{initial}$ and the final voltage $U_{meas}$ of the battery are plotted in a two-dimensional coordinate system as a function of time in dependence of the removed amount of charge, and the expected voltage $U_{expected}$ is plotted in the two-dimensional coordinate system as a function of time in dependence of the removed amount of charge, the slope of the connecting line between the initial voltage $U_{initial}$ and the final voltage $U_{meas}$ as well as the slope of the connecting line between the initial voltage $U_{initial}$ and the expected voltage $U_{expected}$ are determined, wherefrom the difference between the slopes of the connecting lines or the angle between the connecting lines is determined. These determined values can then be used to determine the actual capacity.

It will be understood that the afore-described method—as well as all the other methods disclosed here—can and are carried out in practice with a corresponding computing device and by using suitable digital or digitized data.

Because the determination of a reduced actual capacity of a battery is extremely important, for example, for the energy management an electric vehicle or a hybrid vehicle, and the actual capacity is used for example for range prediction, it is provided according to another advantageous embodiment of the invention that when the assessment of the aging state results in an actual capacity that is reduced in comparison to a new battery, a reduced nominal, removable, available and/or actual capacity is/are stored in a memory device.

This/these stored value(s) are then available, for example, to other facilities for other calculations and/or assessments and may, for example, be read from the memory device.

When the assessment of the aging state has resulted in an actual capacity that is reduced in comparison to a new battery, the size of the nominal, removable and/or available capacity is advantageously reduced by a specifiable value for a characteristic curve field described by a mathematical formula and/or for a characteristic curve described by a mathematical formula.

Because of the stability of the system, the determined change in the actual capacity is not fully applied, but only an adaptation in the corresponding change direction is specified. It is hence advantageous when the determined reduction of the actual capacity not used to its full extent for determining the nominal, removable and/or available capacity.

The present invention also includes a device for determining the actual capacity of a battery with a memory device, a voltage measuring device, a current measuring device, a temperature measuring device and a computing device and a computer program executable thereon, wherein the memory device is configured to store or have stored at least one characteristic curve field of a battery, wherein the voltage measuring device is configured to measure at least one initial voltage $U_{start}$ of the battery at the start and a final voltage $U_{meas}$ of the battery at the end of a discharge process, wherein the current measuring device is configured to measure at least the magnitude of a discharge current of the battery, wherein the temperature measuring device is configured to measure the temperature of at least one battery component, and the computing device with the computer program running thereon is configured to determine the actual capacity of the battery by taking into account the initial voltage $U_{start}$, the final voltage $U_{meas}$ and the expected voltage $U_{expected}$ based on the selected characteristic curve, such that in the event that the final voltage ($U_{meas}$, is smaller than the expected voltage $U_{expected}$ based on the discharge process, it is affirmed that the actual capacity of the battery is smaller than the removable capacity assumed at the start of the discharge process.

The device according to the invention is further configured to carry out each of the above-described methods. An embodiment of the device according to the invention suitable to carry out all methods according to the invention is known to those skilled in the art or can be easily determined with a few experiments.

BRIEF DESCRIPTION OF THE DRAWING

The present invention will now be described in more detail with reference to the accompanying drawings.

These show in.

DETAILED DESCRIPTION OF PREFERRED EMBODIMENTS

The exemplary embodiments described below represent preferred embodiments of the present invention. The present invention is of course not limited to these embodiments.

In the following description, the following terms each have the specified meaning:
Nominal capacity: The amount of current removable according to the manufacturer's specification, normalized to a standard temperature and a reference current (also referred to as rated capacity);
Removable capacity: the different actually removable amount of current for each battery/accumulator technology in dependence of the temperature and the amperage;
Available capacity: measured capacity at standard temperature and reference current; to be used for assessing the deviation from the nominal capacity;
Actual capacity: actually removable capacity in dependence of the temperature and the amperage.

Figure 1:
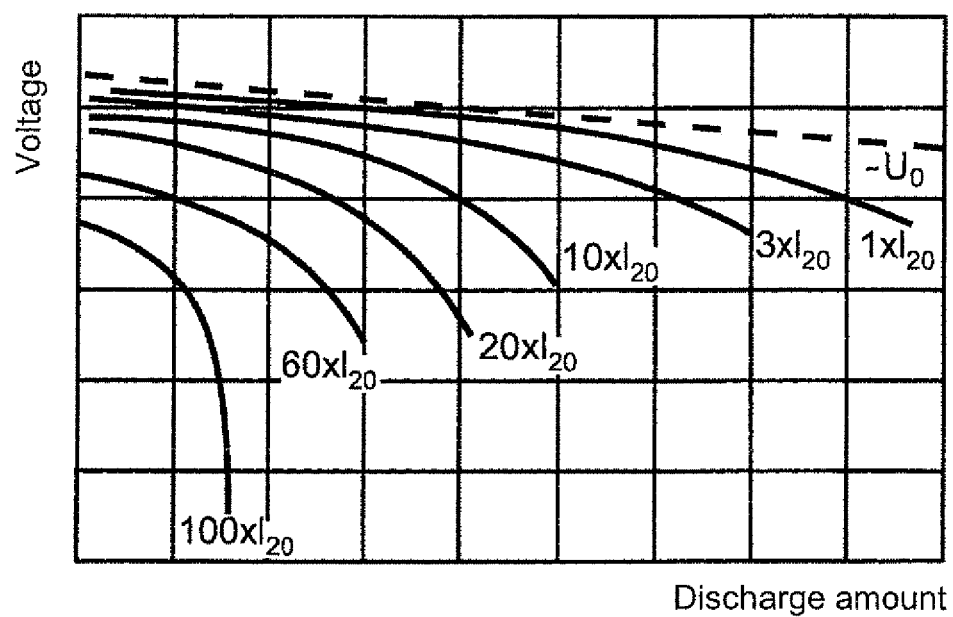
FIG. 1: a diagram with several characteristic curves stored in a characteristic curve field of a battery.

The diagram in FIG. 1 shows voltage profiles of a battery when discharged with different current magnitudes at a specified temperature as well as the approximate profile of the open-circuit voltage $U_0$.

$I_{20}$ indicated in the diagram represents a 20-hour discharge current based on the nominal capacity. As shown in the diagram, the initial voltage (voltage level) of the battery decreases with increasing current magnitude (=increasing multiple of $I_{20}$). At the same time, the removable amount of current decreases with increased current magnitude. Another dependence exists with reference to the temperature of the battery. In this case, in a simplified analysis, the discharge amounts become smaller and the battery voltage decreases with decreasing temperature.

A characteristic curve field may be generated based on this understanding or though measurements, wherein the individual characteristic curves are generated by taking into account the discharge current, the temperature and the removable capacity of the battery.

The battery state may be assessed based on the characteristic curve field and by considering the discharge current and the temperature. The current state of the battery may be assessed, and/or are the removable amount of charge may be estimated and the aging condition of the battery may be assessed by comparing the actual voltage profile with the voltage profile expected based on the selected characteristic curve and by considering the actually removed amount of charge.

According to the invention, the quiescent state of the battery need not be assessed.

Figure 2:
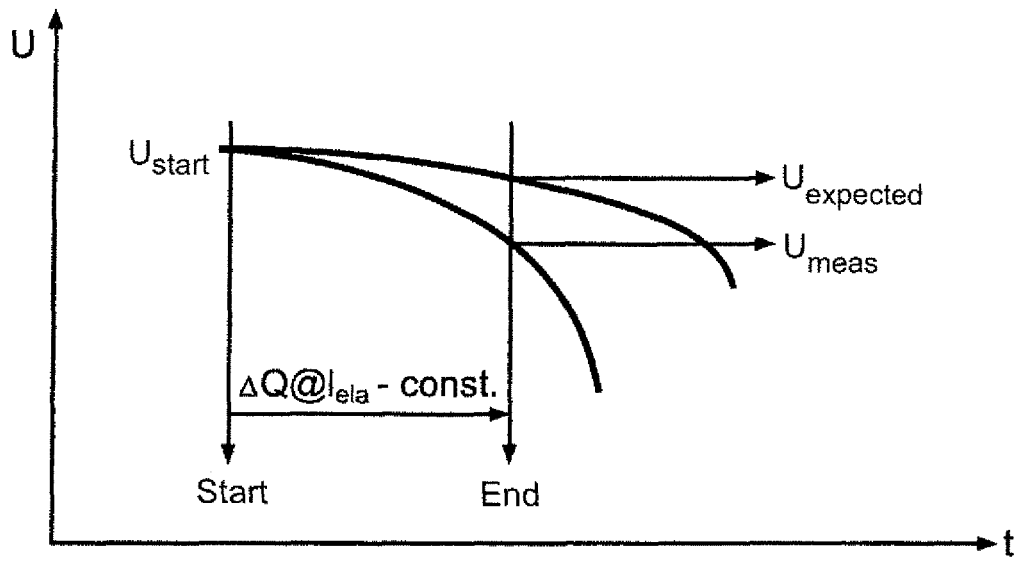
FIG. 2: a diagram with the actual course of the voltage of a battery plotted as a function of time in dependence of the removed amount of charge and the corresponding expected course of the voltage based on the selected characteristic curve.
Figure 3:
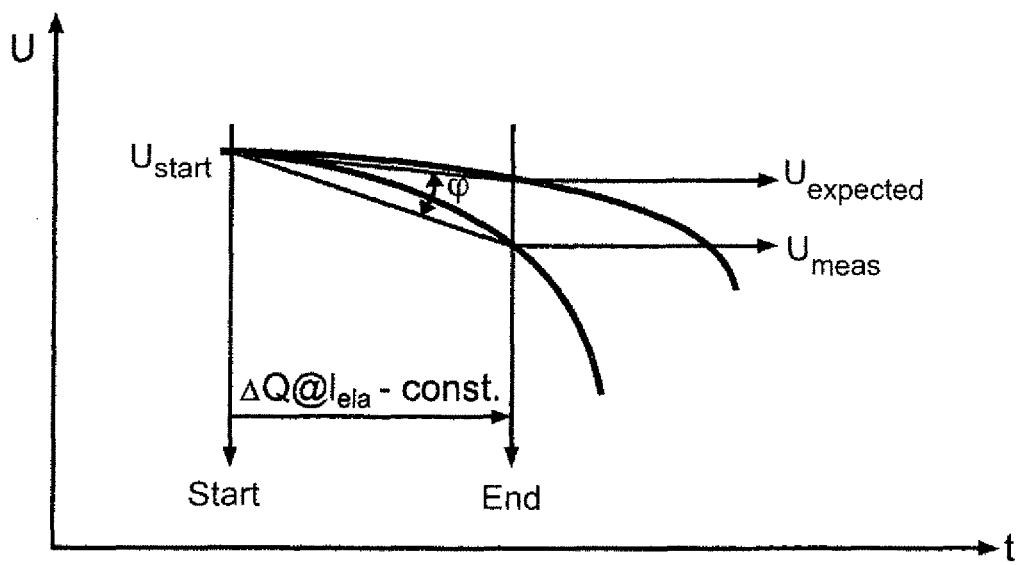
FIG. 3: a similar diagram as in FIG. 2, however with inserted connecting lines between $U_{start}$ and $U_{meas}$, as well as between $U_{start}$ and $U_{expected}$ The diagrams in the figures are merely schematic and not scale.

FIG. 2 and FIG. 3 show each a diagram wherein the actual course of the voltage U a battery is plotted as a function of time t in dependence of the removed amount of charge ΔQ and the expected corresponding voltage profile based on the selected characteristic curve. As evident from the diagram, an essentially constant current magnitude $I_{ela}$ is assumed during the time t.

According to the invention, the characteristic curve to be selected is selected from the characteristic curve field based on the initial voltage $U_{start}$ of the battery, the magnitude of the discharge current and the temperature of the battery.

At the end of the discharge process, the final voltage $U_{meas}$ of the battery is measured, and this final voltage $U_{meas}$ is compared at the end the discharge process with the expected voltage $U_{expected}$ based on the selected characteristic curve. For the case shown in the FIGS. 2 and 3, where the final voltage $U_{meas}$ at the end of the discharge process is smaller than the expected voltage $U_{expected}$, it is concluded that the actual capacity of the battery is smaller than the assumed removable capacity at the start of discharge process.

The calculation of the actual capacity or the calculation of the reduction of the actual capacity compared to the nominal, removable and/or available capacity may be based on known experience values or calculation methods.

As shown in FIGS. 2 and 3, the initial voltage $U_{start}$ and the final voltage $U_{meas}$ of the battery may be plotted as a function of time in dependence of the removed amount of charge and the expected voltage $U_{expected}$ may be plotted as a function of time in dependence of the removed amount of charge in a two-dimensional coordinate system, corresponding to a two-dimensional data array when using a computing device.

With the method according to the invention, the initial voltage $U_{start}$ is measured at the start a discharge process. Because this depends, among other things, from the magnitude of the discharge current, the term "at the start" is here to be understood that a sufficient time may optionally be let to pass at the start of the discharge process (e.g. 1, 2, 4, 6, 8, 10, 15, 30 seconds; 1, 2, 3, 4, 5 minutes) until a "stable" initial voltage is reached. As is known in the art, the time until a "stable" initial voltage is reached depends on the discharge current in such a way that a time in the range of minutes is sufficient at low current magnitudes (e.g. in the range of approximately $1 \times I_{20}$ to approximately $5 \times I_{20}$), and a time of less than one minute is sufficient at high current magnitudes (e.g. in the range above about $10 \times I_{20}$).

Because the end of a discharge process is typically not known during the discharge process, the voltage of the battery may of course be continuously measured during a discharge process or at presettable time intervals. After the discharge process is completed, the last voltage measured during the discharge process is then used as the final voltage $U_{meas}$.

As shown in FIGS. 2 and 3, the determined difference between $U_{meas}$ and $U_{expected}$ in conjunction with the used characteristic curve may be used for assessing the aging state of a battery.

For example, as illustrated in FIG. 3, the slope the connecting line between the initial voltage $U_{start}$ and the final voltage $U_{meas}$, as well as the slope of the connecting line between the initial voltage $U_{start}$ and the expected voltage $U_{expected}$ may be determined, the difference of the slopes of the connecting lines or the angle φ between the connecting lines may be determined, and used to determine the actual capacity.

For example, if the angle φ shown in FIG. 3 exceeds a presettable threshold value, the removable capacity may be reduced by a certain amount based on the aging assessment, or the available capacity may be calculated based on a "smaller" battery.

Experience has shown that the determination of the actual capacity of a battery should not be based on a single measurement; instead, the measurement should be repeated sequentially several times, preferably at least 5 times or more often (e.g. 6, 7, 8, 9, 10, 12, 14, 15 times) and an assessment of the deviation $U_{expected}-U_{meas}$ or of the angle φ be performed. This is based on the fact that the variables to be determined can be influenced by many parameters, and that with a sufficient number of repetitions and a corresponding evaluation of the determined measurement results (e.g. by forming the average) a sufficiently exact approximation to the actual aging condition of the battery can be achieved. In general, the accuracy for assessing the aging state of the battery increases with an increasing number at measurements.

For sake of system stability, it is frequently also advantageous when the determined reduction of the actual capacity does not enter into the calculation of the nominal, removable and/or available capacity, but only an adaptation in the corresponding direction of change is made. For example, the determined reduction of the actual capacity can be multiplied with a specifiable factor <1 (e.g. 0.9; 0.8; 0.75; 0.6; 0.5) and the resulting fraction of the determined reduction of the actual capacity may be used for the assessment or calculation.

When the used characteristic curve field or the used characteristic curve is described by a mathematical formula, the amount of the nominal, removable and/or available capacity may be reduced by a defined value Delta.

The aging process and the associated change in the available capacity of a battery is not a variable that starts out stochastically, but is rather a slowly changing variable. In view of this backdrop, the method according to the invention may for example be repeated continuously, at presettable time intervals and/or after a presettable number at charging and discharging processes.

The method according to the invention can be used in normal applications, is simple to apply, does not require special test modes or test procedures, and is not based on complicated parameters and/or models. With the method according to the invention, a specific statement about the actual energy content of a battery can already readily be made during the ongoing operation. Based on the actual battery capacity that is correctly tracked or corrected by the method according to the invention, a precise conclusion concerning the actually available amount of current of a battery can be drawn. The method according to the invention has the additional advantage that it can be used independent of the cell technology and does not require Ah-integration.

What is claimed is:

1. A device for determining an actual capacity of a battery of an electric vehicle or a hybrid vehicle, comprising:
    a memory device configured to store or have stored therein at least one characteristic curve field of a battery having characteristic curves, wherein the characteristic curves were generated by taking into account a magnitude of a discharge current, a temperature of the battery and a removable capacity of the battery,
    a voltage measuring device configured to measure at least an initial voltage of the battery under load at a start of a discharge process and a final voltage of the battery under load at an end of the discharge process,
    a current measuring device configured to measure at least a magnitude of the discharge current of the battery,
    a temperature measuring device configured to measure the temperature of at least one battery component, and
    a computing device having a computer program executable thereon, wherein the computing device is configured to determine an actual capacity of the battery, by taking into account an initial voltage, a final voltage and a voltage expected based on a selected characteristic curve, such that when the final voltage is smaller than the expected voltage, it is concluded that the actual capacity of the battery is smaller than a removable capacity assumed at the start of the discharge process, the computing device further configured to predict a driving range of the vehicle using the actual capacity of the battery.

2. The device of claim 1, wherein the computing device determines the actual capacity of the battery several times by repeating measurements of the initial voltage, the final voltage and the voltage expected based on the selected characteristic curve, and assesses each time a determined difference between the final voltage and the expected voltage.

3. The device of claim 2, wherein the measurements are repeated at least 5 times.

4. The device of claim 1, wherein the computing device is further configured to
    enter the initial voltage, the final voltage and the expected voltage as a function of time and in dependence of the removed amount of charge in a two-dimensional coordinate system,
    determine a slope of a connecting line between the initial voltage and the final voltage as well as a slope of a connecting line between the initial voltage and the expected voltage,
    determine a difference of the slopes of the connecting lines or an angle between the connecting lines, and
    determine a nominal, removable, available or actual capacity based on the difference of the slopes of the connecting lines or the angle.

5. The device of claim 4, further comprising a memory device, wherein when the determined actual capacity is smaller than an actual capacity of a new battery, a reduced nominal, removable, available or actual capacity is stored in the memory device.

6. The device of claim 5, wherein when the determined actual capacity is smaller than an actual capacity of a new battery, the nominal, removable or available capacity is reduced by a specifiable value when the characteristic curve field or the characteristic curve is described by a mathematical formula.

7. The device of claim 6, wherein the nominal, removable or available capacity is reduced by less than the full specifiable value.

* * * * *